United States Patent
Kim et al.

(10) Patent No.: US 8,669,577 B2
(45) Date of Patent: Mar. 11, 2014

(54) LIGHT EMITTING DIODE

(75) Inventors: SungKyoon Kim, Seoul (KR); SungHo Choo, Seoul (KR); HyunSeoung Ju, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 13 days.

(21) Appl. No.: 13/283,276

(22) Filed: Oct. 27, 2011

(65) Prior Publication Data

US 2012/0043575 A1    Feb. 23, 2012

(30) Foreign Application Priority Data

Oct. 29, 2010   (KR) .................. 10-2010-0107149

(51) Int. Cl.
    *H01L 33/00*    (2010.01)
(52) U.S. Cl.
    USPC .............................. 257/98; 257/91
(58) Field of Classification Search
    USPC .................................................. 257/98, 91
    See application file for complete search history.

(56) References Cited

U.S. PATENT DOCUMENTS

| | | | |
|---|---|---|---|
| 8,338,844 B2 * | 12/2012 | Katsuno et al. | 257/98 |
| 2002/0074558 A1 * | 6/2002 | Hata et al. | 257/89 |
| 2006/0255358 A1 | 11/2006 | Shum | |
| 2009/0283787 A1 | 11/2009 | Donofrio et al. | |
| 2010/0051995 A1 | 3/2010 | Katsuno et al. | |

FOREIGN PATENT DOCUMENTS

EP    1953838    8/2008

OTHER PUBLICATIONS

European Search Report for 11187126.5 dated Jan. 13, 2014, citing the above reference(s).

\* cited by examiner

*Primary Examiner* — Douglas Menz

(74) *Attorney, Agent, or Firm* — Lowe Hauptman & Ham LLP

(57) ABSTRACT

A light emitting diode is disclosed. The disclosed light emitting diode includes a light emitting structure including a first semiconductor layer, a second semiconductor layer, and an active layer interposed between the first and second semiconductor layers, a first electrode electrically connected to the first semiconductor layer, a second electrode electrically connected to the second semiconductor layer, and a first reflection layer disposed on the second semiconductor layer. The first reflection layer includes at least a first layer having a first index of refraction and a second layer having a second index of refraction different from the first index of refraction. The first reflection layer is further disposed on a side surface of the second electrode and a portion of an upper surface of the second electrode.

17 Claims, 12 Drawing Sheets

(a)

(b)

(a)

(b)

LIGHT EMITTING DIODE

CROSS-REFERENCE TO RELATED APPLICATION

This application claims the priority benefit of Korean Patent Application No. 10-2010-0107149, filed on Oct. 29, 2010 in the Korean Intellectual Property Office, the disclosure of which is incorporated herein by reference.

BACKGROUND

1. Field

Embodiments relate to A light emitting diode, and more particularly to A light emitting diode capable of achieving an enhancement in light extraction efficiency, and preventing peeling-off and separation of an electrode when the light emitting device is of a flip-chip type for easy heat dissipation.

2. Description of the Related Art

Fluorescent lamps are required to be frequently replaced due to occurrence of a dark spot, short lifespan, etc. Furthermore, they are inconsistent with demand for more environmentally friendly illumination devices due to use of fluorescent materials. For this reason, fluorescent lamps are gradually being replaced by other light sources.

Among light emitting devices, there is great interest in light emitting diodes (LEDs) as an alternative light source. LEDs have advantages of semiconductors such as rapid processing speed and low power consumption, are environmentally friendly, and have high energy saving effects. Thus, LEDs are a leading next-generation light source. In this regard, practical application of LEDs to replace existing fluorescent lamps is being actively conducted.

Currently, semiconductor light emitting devices such as LEDs are applied to televisions, monitors, notebooks, cellular phones, and various appliances equipped with display devices. In particular, they are widely used as backlight units replacing cold cathode fluorescent lamps (CCFLs).

As the application range of LEDs expands, demand for LEDs having increased brightness is increased because lamps used in home and buildings, lamps for rescue signals, etc. require high brightness.

SUMMARY

Embodiments provide A light emitting diode configured to prevent separation of an electrode and to achieve an enhancement in light emission efficiency while securing protection of the light emitting device.

In one embodiment, A light emitting diode includes a light emitting structure including a first semiconductor layer, a second semiconductor layer, and an active layer interposed between the first and second semiconductor layers, a first electrode electrically connected to the first semiconductor layer, a second electrode electrically connected to the second semiconductor layer, and a first reflection layer disposed on the second semiconductor layer, the first reflection layer including at least a first layer having a first index of refraction and a second layer having a second index of refraction different from the first index of refraction, wherein the first reflection layer is further disposed on a side surface of the second electrode and a portion of an upper surface of the second electrode.

When the light emitting device is of a flip-chip type, provision of the first reflection layer formed on the outer surface of the light emitting device may achieve an enhancement in light emission efficiency and an enhancement in heat dissipation efficiency.

BRIEF DESCRIPTION OF THE DRAWINGS

Details of embodiments will be more clearly understood from the following detailed description taken in conjunction with the accompanying drawings, in which.

DETAILED DESCRIPTION OF EMBODIMENTS

Figure 1:
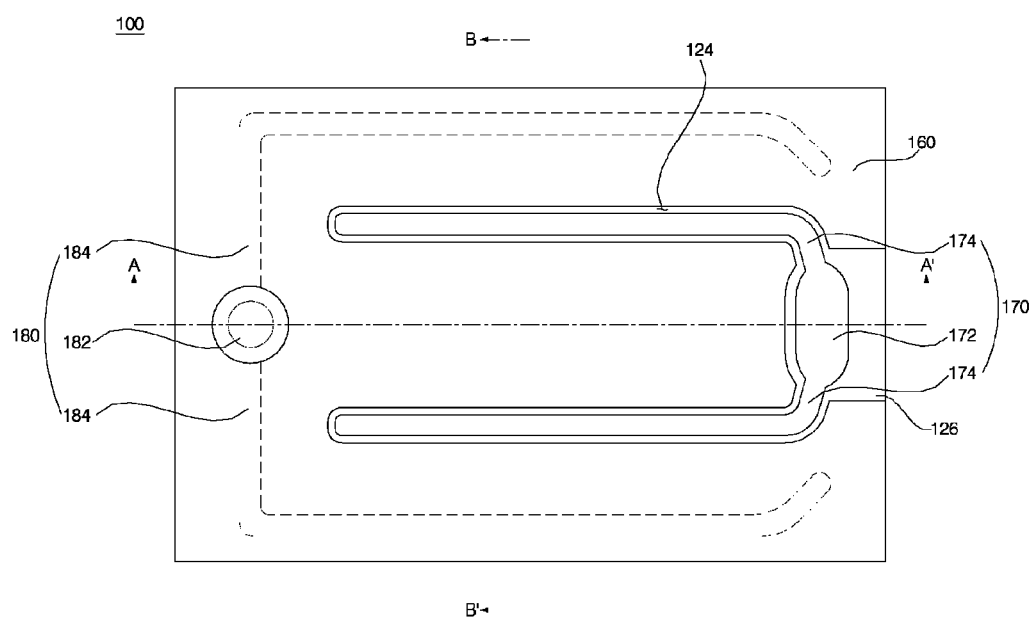
FIG. 1 is a plan view illustrating A light emitting diode according to an exemplary embodiment.

Reference will now be made in detail to embodiments, examples of which are illustrated in the accompanying drawings. However, the present disclosure may be embodied in many different forms and should not be construed as limited to the embodiments set forth herein. Rather, these embodiments are provided so that this disclosure will be thorough and complete, and will fully convey the scope of the disclosure to those skilled in the art. The present disclosure is defined only by the categories of the claims. In certain embodiments, detailed descriptions of device constructions or processes well known in the art may be omitted to avoid obscuring appreciation of the disclosure by a person of ordinary skill in the art. Wherever possible, the same reference numbers will be used throughout the drawings to refer to the same or like parts.

Spatially-relative terms such as "below", "beneath", "lower", "above", or "upper" may be used herein to describe one element's relationship to another element as illustrated in the Figures. It will be understood that spatially-relative terms are intended to encompass different orientations of the device in addition to the orientation depicted in the Figures. For example, if the device in one of the figures is turned over, elements described as "below" or "beneath" other elements would then be oriented "above" the other elements. The exemplary terms "below" or "beneath" can, therefore, encompass both an orientation of above and below. Since the device may be oriented in another direction, the spatially-relative terms may be interpreted in accordance with the orientation of the device.

The terminology used in the present disclosure is for the purpose of describing particular embodiments only and is not intended to limit the disclosure. As used in the disclosure and the appended claims, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, the thickness or size of each layer is exaggerated, omitted, or schematically illustrated for convenience in description and clarity. Also, the size or area of each constituent element does not entirely reflect the actual size thereof.

Angles or directions used to describe the structures of light emitting devices according to embodiments are based on those shown in the drawings. Unless there is, in the specification, no definition of a reference point to describe angular positional relations in the structures of the light emitting devices, the associated drawings may be referred to.

Figure 2:
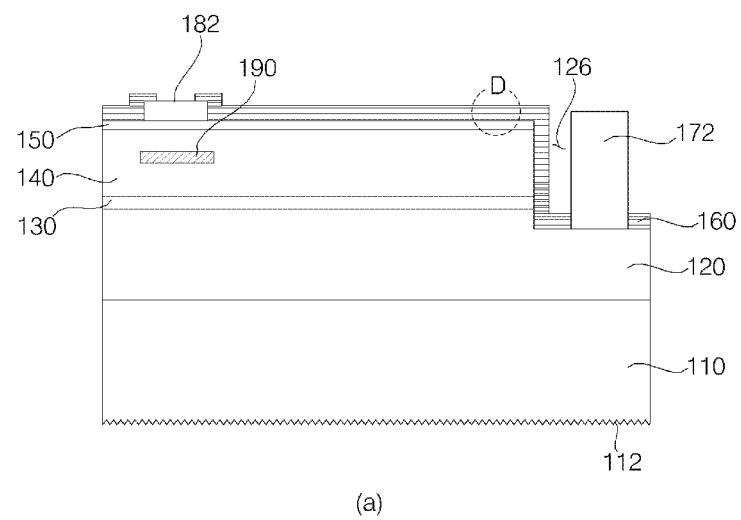
FIG. 2(a) is a cross-sectional view taken along a line A-A' of FIG. 1.
FIG. 2(B) is a cross-sectional view taken along a line B-B' of FIG. 1.
Figure 2:
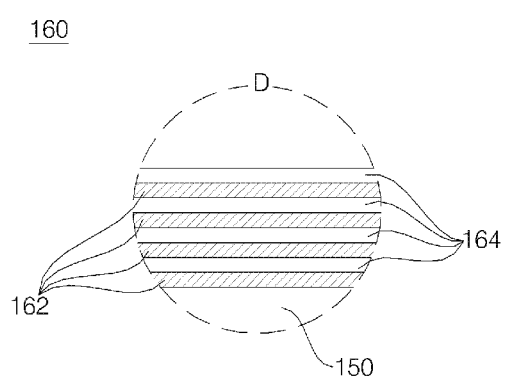
Figure 4:
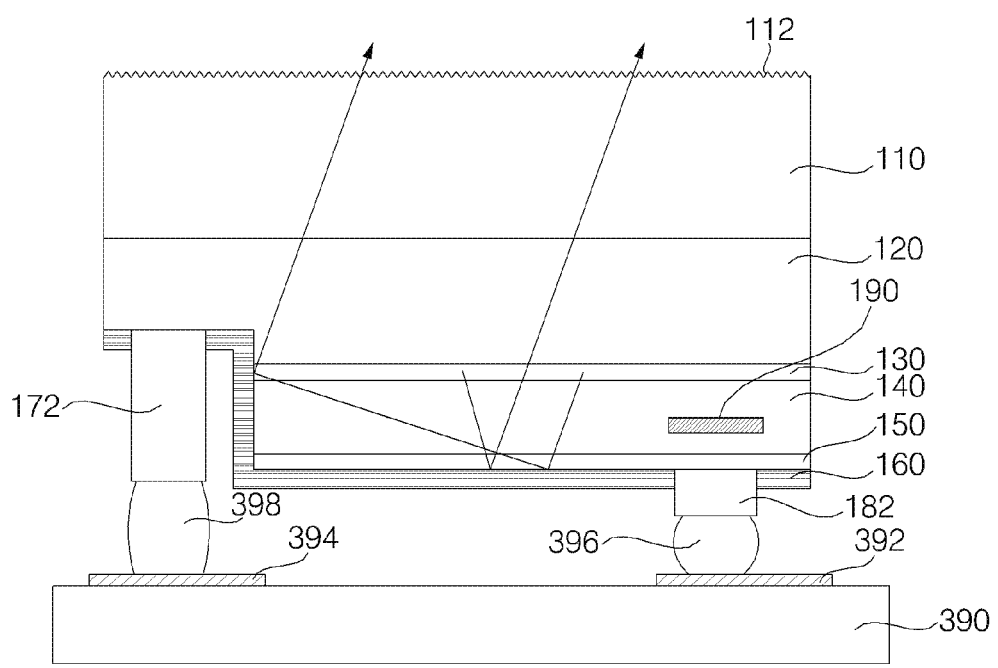
FIG. 4 is a view illustrating a state in which the light emitting device according to the illustrated embodiment is flip-chip-bonded to a package substrate.

FIG. 1 is a plan view illustrating A light emitting diode according to an exemplary embodiment. FIG. 2($a$) is a cross-sectional view taken along a line A-A' of FIG. 1. FIG. 2(B) is a cross-sectional view taken along a line B-B' of FIG. 1. FIG. 4 is a view illustrating a state in which the light emitting device according to the illustrated embodiment is flip-chip-bonded to a package substrate.

Figure 3:
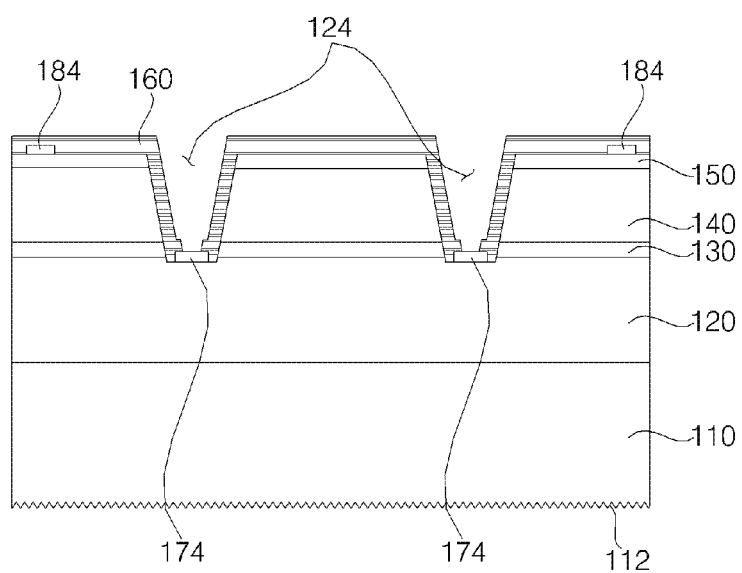

Referring to FIGS. 1 to 3, the light emitting device according to the illustrated embodiment, which is designated by reference numeral "100", may include a substrate 110, a first semiconductor layer 120, an active layer 130, a second semiconductor layer 140, and a first reflection layer 160 formed on the second semiconductor layer 140. The light emitting device 100 according to the illustrated embodiment may further include a first electrode 170 electrically connected to the first semiconductor layer 120, and a second electrode 180 electrically connected to the second semiconductor layer 140.

In particular, referring to FIG. 2($a$), the substrate 110 has light transmitting properties. The substrate 110 may be a substrate made of a material different from a semiconductor layer to be formed thereon, for example, a substrate made of sapphire ($Al_2O_3$), or a substrate made of the same material as the semiconductor layer, for example, a substrate made of GaN. Alternatively, the substrate 110 may be a substrate made of silicon carbide (SiC) having higher thermal conductivity than the sapphire ($Al_2O_3$) substrate. Of course, the substrate 110 is not limited to the above-described materials.

A surface irregularity pattern 112 may be formed at a lower surface of the substrate 110, to achieve an enhancement in light extraction efficiency.

The surface, on which the surface irregularity pattern 112 is formed, opposes a surface of the substrate 110, on which a light emitting structure is formed. The surface irregularity pattern 112 may be formed using an etching method. For example, a dry etching method or a wet etching method may be used, although the present disclosure is not limited thereto. In accordance with the surface irregularity pattern, it may be possible to prevent total reflection of light, and thus to achieve an enhancement in light extraction efficiency.

Meanwhile, although not shown, an anti-reflection layer to achieve an enhancement in light extraction efficiency may further be formed at the lower surface of the substrate 110. The anti-reflection layer is referred to as an anti-reflective (AR) coating layer. The anti-reflection layer basically utilizes interference among reflected light reflected from a plurality of interfaces. That is, the anti-reflection layer functions to shift the phases of light reflected from different interfaces such that the phases have a difference of 180°, namely, to offset the light, thereby reducing the intensities of reflected light, although the present disclosure is not limited thereto.

Although not shown, a buffer layer (not shown) may be formed over a substrate 110, to reduce lattice misalignment between the substrate 110 and the first semiconductor layer 120 while enabling easy growth of the semiconductor layers. The buffer layer may include AlN and GaN, to have an AlInN/GaN laminate structure, an $In_xGa_{1-x}N$/GaN laminate structure, an $Al_xIn_yGa_{1-x-y}$/$In_xGa_{1-x}N$/GaN laminate structure, etc.

The first semiconductor layer 120 may include an n-type semiconductor layer to supply electrons to the active layer 130. The first semiconductor layer 120 may be formed of a first-conductivity-type semiconductor layer alone, or may further include an undoped semiconductor layer disposed beneath the first-conductivity-type semiconductor layer. Of course, the first semiconductor layer 120 is not limited to such structures.

When the first-conductivity type semiconductor layer includes an n-type semiconductor layer, the n-type semiconductor layer may be made of a semiconductor material having a formula of $In_xAl_yGa_{1-x-y}N$ ($0 \leq x \leq 1$, $0 \leq y \leq 1$, and $0 \leq x+y \leq 1$), for example, GaN, AlN, AlGaN, InGaN, InN, InAlGaN, or AlInN. The n-type semiconductor layer may be doped with an n-type dopant such as Si, Ge, or Sn.

The undoped semiconductor layer is formed to achieve an enhancement in the crystallinity of the first-conductivity-type semiconductor layer. The undoped semiconductor layer is identical to the first-conductivity-type semiconductor layer, except that it has considerably low electrical conductivity, as compared to the first-conductivity-type semiconductor layer, because the undoped semiconductor layer is not doped with an n-type dopant.

The first semiconductor layer 120 may be formed by supplying silane ($SiH_4$) gas containing a first dopant such as $NH_3$, TMGa, or Si. The first semiconductor layer 120 may have a multilayer structure. The first semiconductor layer 120 may further include a clad layer.

The active layer 130 may be disposed over the first semiconductor layer 120. The active layer 130 may be a region where electrons and holes are recombined. In accordance with recombination of electrons and holes, the active layer 130 transits to a lower energy level, so that it may generate light having a wavelength corresponding to the energy level.

The active layer 130 may be made of, for example, a semiconductor material having a formula of $In_xAl_yGa_{1-x-y}N$ ($0 \leq x \leq 1$, $0 \leq y \leq 1$, and $0 \leq x+y \leq 1$). The active layer 130 may have a single quantum well structure or a multi-quantum well (MQW) structure. Alternatively, the active layer 130 may include a quantum wire structure or a quantum dot structure.

The second semiconductor layer 140 may function to inject holes into the active layer 130. The second semiconductor layer 140 may be implemented as a p-type semiconductor layer. In this case, the second semiconductor layer 140 may be made of, for example, a semiconductor material having a formula of $In_xAl_yGa_{1-x-y}N$ ($0 \le x \le 1$, $0 \le y \le 1$, and $0 \le x+y \le 1$), for example, GaN, AlN, AlGaN, InGaN, InN, InAlGaN, or AlInN. The p-type semiconductor layer may be doped with a p-type dopant such as Mg, Zn, Ca, Sr, and Ba.

The above-described first semiconductor layer 120, active layer 130, and second semiconductor layer 140 may be formed using metal organic chemical vapor deposition (MOCVD), chemical vapor deposition (CVD), plasma-enhanced chemical vapor deposition (PECVD), molecular beam epitaxy (MBE), hydride vapor phase epitaxy (HYPE), or a sputtering method. Of course, the formation method is not limited to the above-described methods.

A third semiconductor layer (not shown) may be formed on the first and second semiconductor layers 120 and 140. The third semiconductor layer may include an n-type or p-type semiconductor layer. As a result, the light emitting structure 100 may include at least one of np, pn, npn, and pnp junction structures.

The concentrations of the dopants in the first and second semiconductor layers 120 and 140 may be uniform or non-uniform. That is, various multilayer semiconductor layer structures may be provided, although the present disclosure is not limited thereto.

Contrary to the above-described embodiment, the first semiconductor layer 120 may be implemented by a p-type semiconductor layer, and the second semiconductor layer 140 may be implemented by an n-type semiconductor layer. That is, the formation positions of the first and second semiconductor layers 12- and 140 with respect to the active layer 130 may be reversed. However, the following description will be given in conjunction with the case in which the first semiconductor layer 120 is implemented using an n-type semiconductor layer, and is disposed near the substrate 110.

Again referring to FIG. 2(a), the first electrode 170 may have various structures so that it is electrically connected to the first semiconductor layer 120. For example, the active layer 130 and second semiconductor layer 140 are partially removed such that the upper surface of the first semiconductor layer 120 is partially exposed. The first electrode 170 may be formed on the exposed portion of the first semiconductor layer 120. Of course, the present disclosure is not limited to the above-described structure.

The first electrode 170 may include a first electrode pad 172, and one or more first electrode wings 174 connected to the first electrode pad 172. The first electrode wings 174 extend from the first electrode pad 172 in a direction opposite the first electrode pad 172. The arrangement and number of the first electrode wings 174 may be determined, taking into consideration the area of the light emitting device and current diffusion occurring in the light emitting device. Various arrangements of the first electrode wings 174 may be implemented.

The partial exposure of the first semiconductor layer 120 may be achieved using a certain etching method.

The second electrode 180 may be formed on the second semiconductor layer 140.

The second electrode may include a second electrode pad 182 disposed at one side of the second semiconductor layer 140 opposite the first electrode pad 172, and one or more second electrode wings 184 connected to the second electrode pad 182. The second electrode wings 184 extend from the second electrode pad 182 in a direction opposite the second electrode pad 182.

The second electrode wings 184 function to achieve an enhancement in current diffusion. In accordance with the size and area of the light emitting device, the second electrode wings 184 may have various structures. Also, there is no limitation as to the shape of the second electrode wings 184.

A step may be formed between the second electrode pad 182 and each second electrode wing 194. Alternatively, there may be no step between the second electrode pad 182 and each second electrode wing 194. In the illustrated embodiment, however, the second electrode pad 182 may be formed at a higher level than the second electrode wings 184, to define a step. That is, the second electrode 180 may have a step to enable the second electrode pad 182 to be outwardly exposed through the first reflection layer 160. Even if the second electrode pad 182 is formed at a lower level than the first reflection layer 160, there is no problem because the first reflection layer 160 has an exposure region.

The second electrode pad 182 may be made of a metal material such as nickel (Ni), chromium (Cr), platinum (Pt), gold (Au), silver (Ag), titanium (Ti), or tungsten (W), or a carbon nano-tube, without being limited thereto.

Each first electrode wing 174 or each second electrode wing 184 may include a bent portion. That is, each first electrode wing 174 or each second electrode wing 184 may have various bending structures in accordance with the shape and size of the light emitting device. The bent portion may have a certain curvature.

A light-transmitting electrode layer 150 may be formed over the second semiconductor layer 140. In this case, the second electrode 180 may be formed to be connected to the second semiconductor layer 140 or to be connected to the light-transmitting electrode layer 150.

The light-transmitting electrode layer 150 may include at least one of indium tin oxide (ITO), In—ZnO (IZO), Ga—ZnO (GZO), Al—ZnO (AZO), Al—Ga—ZnO (AGZO), In—Ga—ZnO (IGZO), $IrO_x$, $RuO_x$, $RuO_x$/ITO, $Ni/IrO_x/Au$, and $Ni/IrO_x/Au/ITO$. The light-transmitting electrode layer 150 is formed to completely cover one side surface of the second semiconductor layer 140, to avoid a current crowding phenomenon.

Meanwhile, a current blocking layer 190 may be arranged over the active layer 130 such that at least a portion of the current blocking layer 190 is vertically overlapped with a position where the second electrode pad 182 is formed. Of course, the current blocking layer 190 is not limited to the above-described structure. The current blocking layer 190 may be arranged at any position between an upper surface of the active layer 130 and an upper surface of the second semiconductor layer 140.

The current blocking layer 190 may include a non-conductive material or a material having weak conductivity.

The current blocking layer 190 may be made of silicon dioxide ($SiO_2$) or aluminum oxide ($Al_2O_3$) containing $SiO_2$.

The current blocking layer 190 is provided to avoid a current crowding phenomenon in which electrons crowd beneath the electrodes.

The current blocking layer 190 may have a greater width than the second electrode pad 182, although there is no limitation as to the width of the current blocking layer 190. Thus, it may be possible to effectively avoid a current crowding phenomenon.

Meanwhile, in accordance with the illustrated embodiment, the first reflection layer 160 may be formed on an outer surface of the light emitting device 100, namely, on the second semiconductor layer 140. When the light emitting device 100 according to the illustrated embodiment is of a flip-chip type, provision of the first reflection layer 160 formed on the outer surface of the light emitting device 100 may achieve an enhancement in light emission efficiency by virtue of high reflectance of the first reflection layer 160.

Referring to FIG. 2(b), the first reflection layer 160 may include first layers 162 having a first index of refraction, and second layers 164 having a second index of refraction different from the first index of refraction. That is, the first reflection layer 160 may have a multilayer structure in which the layers 162 and 164 having different indexes of refraction are alternately laminated. For example, each first layer 162 may be a layer having a lower index of refraction, and each second layer 164 may be a layer having a higher index of refraction, although the present disclosure is not limited thereto.

Meanwhile, when it is assumed that "λ" represents the wavelength of light generated by the active layer 130, "n" represents the index of refraction of a medium, and "m" represents an odd constant, the first reflection layer 160 is formed to have a semiconductor laminate structure capable of obtaining a reflectance of 95% or more for light of a particular wavelength band A by repeatedly and alternately laminating the first layer 162, which has a lower index of refraction, and the second layer 164, which has a higher index of refraction, to a thickness of mλ/4n.

Accordingly, each first layer 162, which has a lower index of refraction, and each second layer 164, which has a higher index of refraction, may have a thickness corresponding to λ/4 times a reference wavelength. In this case, the thickness of each of the layers 163 and 164 may be 2 Å to 10 μm. Also, the first reflection layer 160 may have a multilayer structure including 20 to 40 layers. Each of the layers 163 and 164 constituting the first reflection layer 160 may be made of $M_xO_y$ or $M_xO_yN_z$ (M: metal or ceramics; 0: oxide; N: nitride; and X, Y, and Z: constants).

For example, for each first layer 162, which has a lower index of refraction, $SiO_2$ having an index of refraction corresponding to "1.4" or $Al_2O_3$ having an index of refraction corresponding to "1.6" may be used. For each second layer 164, which has a higher index of refraction, $TiO_2$ having an index of refraction corresponding to "2" or more. Of course, the present disclosure is not limited to such materials.

Meanwhile, it may be possible to increase the reflectance of the first reflection layer 160 by increasing the index of refraction of a medium between the first and second layers 162 and 164.

Since the first reflection layer 160 has a high bandgap energy, as compared to an oscillation wavelength, it is difficult for the first reflection layer 160 to absorb light, so that the first reflection layer 160 exhibits high reflectance.

In particular, referring to FIGS. 1 and 2(a), the first reflection layer 160 may be disposed on a side surface of the second electrode 180 and a portion of the upper surface of the second electrode 180. In other words, the first reflection layer 160 may be disposed on the upper surface of the second semiconductor layer 140 while being disposed on the side surface of the second electrode 180 and the upper surface portion of the second electrode 180.

In this case, the first reflection layer 160 may be disposed on the side surfaces and upper surface portions of the second electrode pad 182 and second electrode wing 184. Alternatively, the first reflection layer 160 may be disposed over the entire upper surface of the second electrode wing 184 and an upper surface portion of the second electrode pad 182. Although the first reflection layer 160 is illustrated in FIG. 3 as being disposed over the entire upper surface of the second electrode wing 184, the present disclosure is not limited thereto.

When the first reflection layer 160 is used, it may be possible to prevent separation and peeling-off of the pads while achieving an enhancement in light extraction efficiency.

Again referring to FIGS. 1, 2(a), and 3, the first electrode pad 172 is outwardly exposed at an upper surface portion thereof, and the second electrode wing 184 is covered by the first reflection layer 160. In accordance with this structure, a current diffusion effect is obtained by the second electrode wing 184. When the second electrode wing 184 is disposed on the second semiconductor layer 140, it may interfere with enhancement in light extraction efficiency of the light emitting device. However, the first reflection layer 160 functions to achieve an enhancement in light extraction efficiency while preventing peeling-off of the second electrode wing 184.

In particular, referring to FIGS. 2(a) and 3, the first reflection layer 160 may be disposed on the upper surface of the light emitting structure and the upper surface of the first semiconductor layer 120 while extending from the upper surface of the light emitting structure to the upper surface of the first semiconductor layer 120 along the side surfaces of the second semiconductor layer 140 and active layer 130.

In other words, the light emitting structure is etched from an upper surface thereof at regions where the first electrode pad 172 and each first electrode wing 174 are to be disposed, respectively, using a certain etching method, to form a pad exposure region 126 and a wing exposure region 124. The first reflection layer 160 is formed on the side surfaces of the exposure regions 124 and 126 and on the first semiconductor layer 120. When the light-transmitting electrode layer 150 is formed on the light emitting structure, the first reflection layer 160 may be formed on the upper surface of the light-transmitting electrode layer 150 and on the upper surface of the first semiconductor layer 120 while extending from the upper surface of the light-transmitting electrode layer 150 to the upper surface of the first semiconductor layer 120 along the side surfaces of the light-transmitting electrode layer 150, second semiconductor layer 140, and active layer 130. Accordingly, when light generated by the active layer 130 is directed toward a side surface of the light emitting structure, it is outwardly emitted after being reflected by the first reflection layer 160, so that an enhancement in light extraction efficiency may be achieved. Also, the first reflection layer 160 functions as a passivation layer to protect the light-transmitting electrode layer 150, second semiconductor layer 140, and active layer 130 while preventing separation of the electrodes.

The first reflection layer 160 may extend along the upper surface of the first semiconductor layer 120 while extending from the upper surface of the first semiconductor layer 120 to a portion of the upper surface of each first electrode wing 174 along the side surfaces of the first electrode wing 174. Accordingly, light extraction efficiency may be further increased. It may also be possible to prevent peeling-off and separation of the first electrode wings 174 while protecting the first electrode wings 174. The first reflection layer 160 may be formed by growing a material of the first reflection layer 160 over the entire upper surface of the light emitting device to a desired thickness while controlling a growth time and the number of lamination layers, and then etching the grown layer at regions corresponding to portions of each electrode wing 174. Of course, the present disclosure is not limited to such a formation method.

The first reflection layer 160 may be formed on the pads. This will be described later.

FIG. 4 illustrates a state in which the light emitting device according to the illustrated embodiment is flip-chip-bonded to a package substrate. Hereinafter, the principle of achieving an enhancement in light extraction efficiency by the first reflection layer 160 in the flip-chip-bonded light emitting device according to the illustrated embodiment will be described in detail.

Referring to FIG. 4, the light emitting device 100, which is flip-chip-bonded to a package substrate 390, is illustrated. Meanwhile, conductive patterns 392 and 394 are formed on the package substrate 390. The conductive patterns 392 and 394 are electrically connected to the second electrode pad 182 and first electrode pad 172 of the flip-chip type light emitting device 100 via solders 396 and 398, respectively.

In light emitting devices, heat dissipation becomes increasingly important as brightness increases. However, the flip-chip type light emitting device is suitable as a high brightness light emitting device because it exhibits efficient heat dissipation.

Impact may be generated during a process for manufacturing a flip-chip package, in particular, a die bonding process. To this end, an impact buffering layer (not shown) may be additionally formed on an outer surface of the first reflection layer 160. The impact buffering layer may be made of tungsten (W) or an alloy thereof. Since tungsten (W) or an alloy thereof exhibits excellent thermal conductivity, the impact buffering layer may function as a heat sink.

The first reflection layer 160 formed as described above not only functions as a passivation layer to protect the light-transmitting electrode layer 150 or the first semiconductor layer 120, but also emits light toward the substrate 110 while preventing absorption of light, thereby achieving an enhancement in light extraction efficiency.

That is, as shown in FIG. 4, light generated by the active layer 130 is reflected by the first reflection layer 160 such that the entirety of the light is directed toward the substrate 110. Since the substrate 110, which is made of sapphire ($Al_2O_3$), has an index of refraction corresponding to about 2.4, the first semiconductor layer 120 has an index of refraction corresponding to about 2.0, and the active layer 130 has an index of refraction corresponding to about 1.8, an enhancement in light extraction efficiency may be achieved in accordance with Snell's law in which, when light travels from a medium having a lower index of refraction to a medium having a higher index of refraction, total reflection does not occur at an interface between the mediums.

Figure 5:
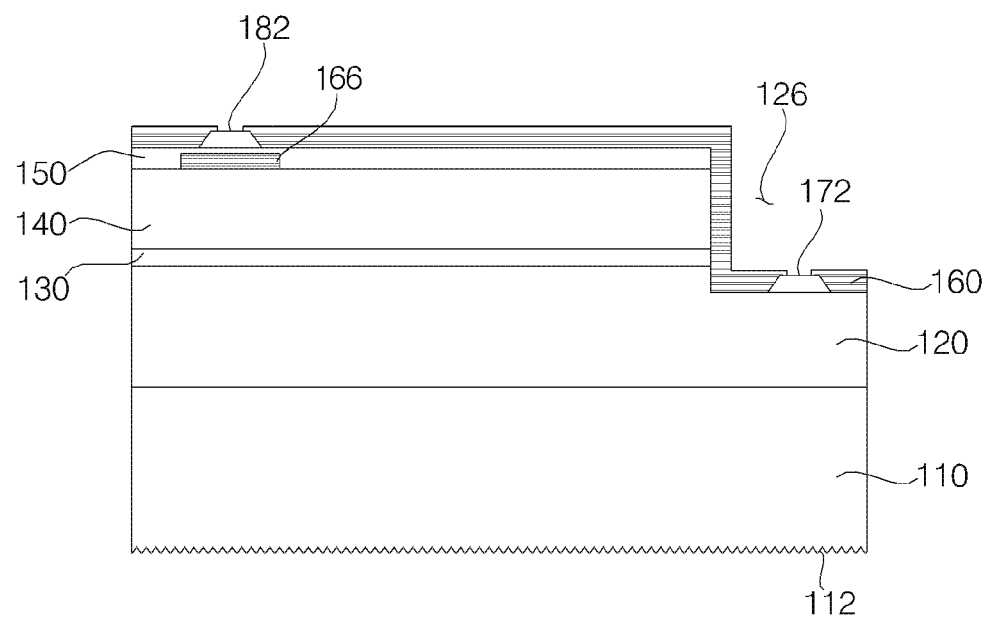
FIG. 5 is a cross-sectional view illustrating A light emitting diode according to another embodiment.

FIG. 5 is a cross-sectional view illustrating A light emitting diode according to another embodiment.

Referring to FIG. 5, the light emitting device according to the illustrated embodiment, which is designated by reference numeral "100", is similar to the embodiment of FIG. 2(a), except that the shapes of the electrode pads are different from those of the embodiment of FIG. 2(a), the first reflection layer 160 is disposed on the side surface of the first electrode pad 172 and a portion of the upper surface of the first electrode pad 172, and a second reflection layer 166 is additionally formed on the second semiconductor layer 140 such that a portion of the second reflection layer 166 is vertically overlapped with the second electrode pad 182. No description will be given of the same constituent elements of the light emitting device shown in FIG. 5 as the light emitting device of FIG. 2(a).

The first reflection layer 160 may be disposed on an upper surface of the first semiconductor layer 120 and a portion of an upper surface of the first electrode pad 172 while extending from the upper surface of the first semiconductor layer 120 to the upper surface portion of the first electrode pad 172 along a side surface of the first electrode pad 172. The first electrode layer 160 may also be disposed on an upper surface of the second semiconductor layer 140 and a portion of an upper surface of the second electrode pad 182 while extending from the upper surface of the second semiconductor layer 140 to the upper surface portion of the second electrode pad 182 along a side surface of the second electrode pad 182.

The first reflection layer 160 may be formed by growing a material of the first reflection layer 160 over the upper surface of the light emitting device to a thickness capable of completely covering the first electrode pad 172 or second electrode pad 182, and then etching the grown layer such that only a desired portion of the first electrode pad 172 or second electrode pad 182 is exposed, using a certain etching method. Thus, it may be possible to prevent separation and peeling-off of the first electrode pad 172 or second electrode pad 182.

The first electrode pad 172 or second electrode pad 182 may have an inclined surface at a side surface thereof. As a result, it may be possible to further prevent the first electrode pad 172 or second electrode pad 182 from being separated from the light emitting structure.

An extension electrode may be connected to the first electrode pad 182, taking into consideration flip-chip bonding to be subsequently carried out.

The second reflection layer 166 is formed on the second semiconductor layer 140 such that a portion of the second reflection layer 166 is vertically overlapped with the second electrode pad 182. The second reflection layer 166 may have the same configuration as the first reflection layer 160.

By virtue of the second reflection layer 166, it may be possible to prevent light generated by the active layer 130 from being absorbed into the second electrode pad 182, and thus to achieve an enhancement in light extraction efficiency of the light emitting device.

Figure 6:
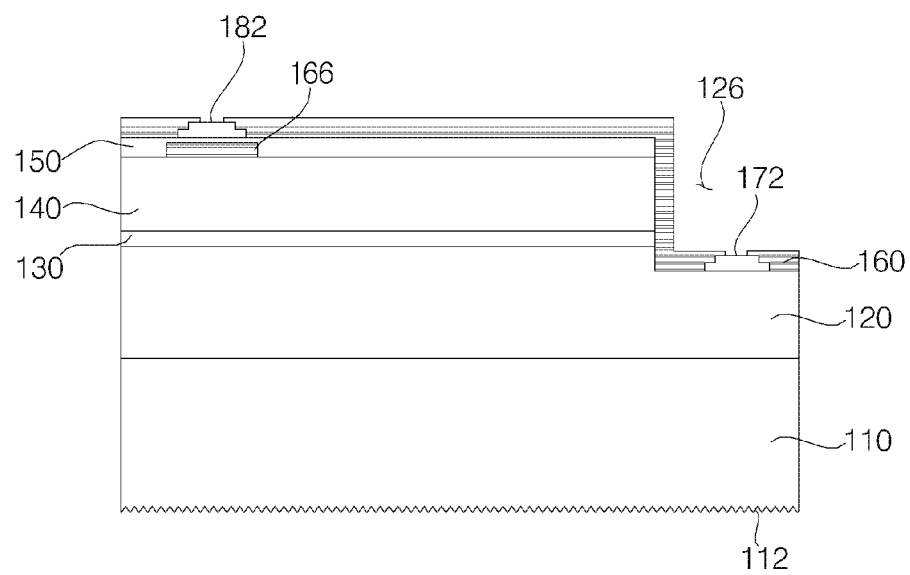
FIG. 6 is a cross-sectional view illustrating A light emitting diode according to another embodiment.

FIG. 6 is a cross-sectional view illustrating A light emitting diode according to another embodiment.

Referring to FIG. 6, the light emitting device according to the illustrated embodiment, which is designated by reference numeral "100", is similar to the embodiment of FIG. 5, except that the first electrode pad 172 or second electrode pad 182 may have one or more steps at a side surface thereof.

There is no limitation as to the number of the steps. That is, the first electrode pad 172 or second electrode pad 182 may have various numbers of steps.

In accordance with the above-described structure, it may be possible to prevent separation of the electrode pad.

Figure 7:
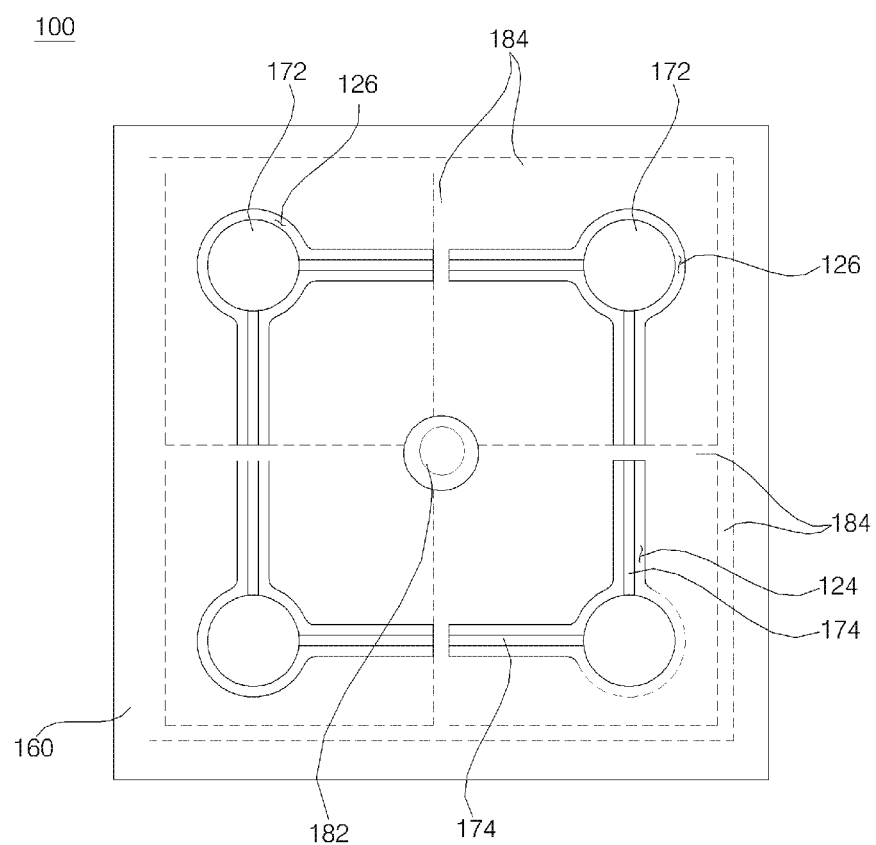
FIG. 7 is a plan view illustrating A light emitting diode according to another embodiment.

FIG. 7 is a plan view illustrating A light emitting diode according to another embodiment.

Referring to FIG. 7, the light emitting device according to the illustrated embodiment, which is designated by reference numeral "100", is different from the light emitting device 100 shown in FIG. 1 in terms of the arrangement of electrodes on the upper surface of the light emitting structure.

That is, the light emitting device 100 according to the embodiment of FIG. 7 may include a second electrode pad 182 disposed at a central portion of the upper surface of the light emitting structure, a plurality of first electrode pads 172 surrounding the second electrode pad 182 while being spaced apart from the second electrode pad 182 by a predetermined distance, and first electrode wings 174 each connected between adjacent ones of the first electrode pads 172.

When the light emitting device 100 is designed to satisfy requirement of high brightness, a plurality of first electrode pads 172 as described above may be arranged to provide electrical stability. In order to provide structural stability during a flip-chip bonding process, four first electrode pads 172 may be arranged as shown in FIG. 7.

For current diffusion, the light emitting device 100 may further include a second electrode wing 184 having a peripheral portion arranged along a peripheral surface of the light emitting device while being spaced apart from the peripheral surface by a predetermined distance, and connecting portions connected to the second electrode pad 182 while being connected to the peripheral portion of the second electrode wing 184.

The arrangement of the electrode pads and electrode wings may be freely variable in accordance with the required brightness and the size of the light emitting device, without being limited to the above-described arrangement.

As the first reflection layer 160 is used, the arrangement and structure of the second electrode wing 184 may be varied. Furthermore, it may be possible to achieve an enhancement in current diffusion and an enhancement in light extraction efficiency of the light emitting device.

Figure 8:
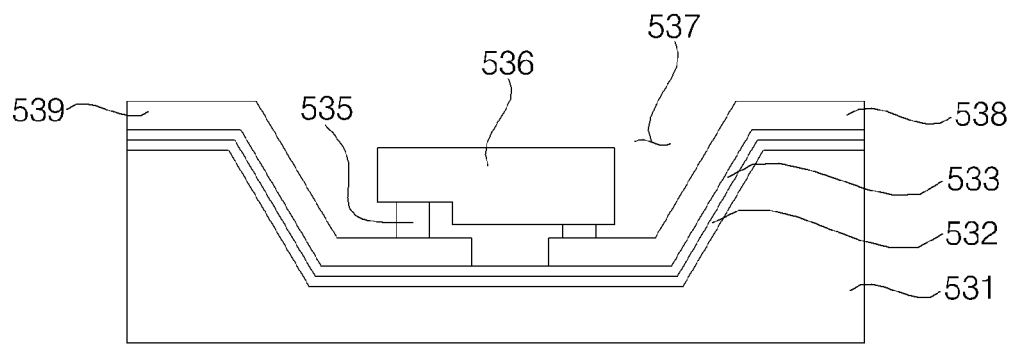
FIG. 8 is a sectional view illustrating A light emitting diode package including A light emitting diode according to an exemplary embodiment.

FIG. 8 is a sectional view illustrating A light emitting diode package including A light emitting diode according to an exemplary embodiment.

Referring to FIG. 8, the light emitting device package according to the illustrated embodiment, which is designated by reference numeral "500", includes a body 531, a first electrode layer 538 formed on the body 531, and a second electrode layer 539 formed on the body 531, and A light emitting diode 536 mounted on the body 531 while being electrically connected to the first and second electrode layers 538 and 539. The light emitting device 536, which has a configuration according to an exemplary embodiment, may be electrically connected to the first and second electrode layers 538 and 539 via solders 538 in a flip-chip manner.

The body 531 may be made of a silicon material, a synthetic resin material, or a metal material. An inclined surface may be formed about the light emitting device 536.

The first and second electrode layers 538 and 539, which are formed to be electrically isolated from each other, supply power to the light emitting device 536. The first and second electrode layers 538 and 539 may reflect light generated from the light emitting device 536 so as to achieve an enhancement in light utilization efficiency. The first and second electrode layers 538 and 539 may also function to outwardly dissipate heat generated from the light emitting device 536.

Meanwhile, a reflection layer 532 may be formed on the body 531 in order to more effectively concentrate emission of light from the light emitting device 536 in a forward direction. Generally, the reflection layer 532, which has the above-described function, may be made of a metal having a high coefficient of reflection such as silver (Ag) or aluminum (Al). In addition, an insulating layer 533 may be formed over the reflection layer 532 in order to prevent the reflection layer 532 from coming into electrical contact with the electrode layers 538 and 539.

A cavity 537 may be formed in the body 531 to allow the light emitting device 536 to be mounted in the cavity 537. The light emitting device 536 may be a light emitting diode. A molding material may fill the cavity 537 to encapsulate the light emitting diode 536. Meanwhile, the molding material may contain a fluorescent substance to vary the wavelength of light emitted from the light emitting diode 536.

Although the above-described embodiment is associated with a flip-chip type light emitting device, it is not limited thereto. For example, the above-described embodiment may be applied to A light emitting diode having a horizontal structure or a vertical structure.

Figure 9:
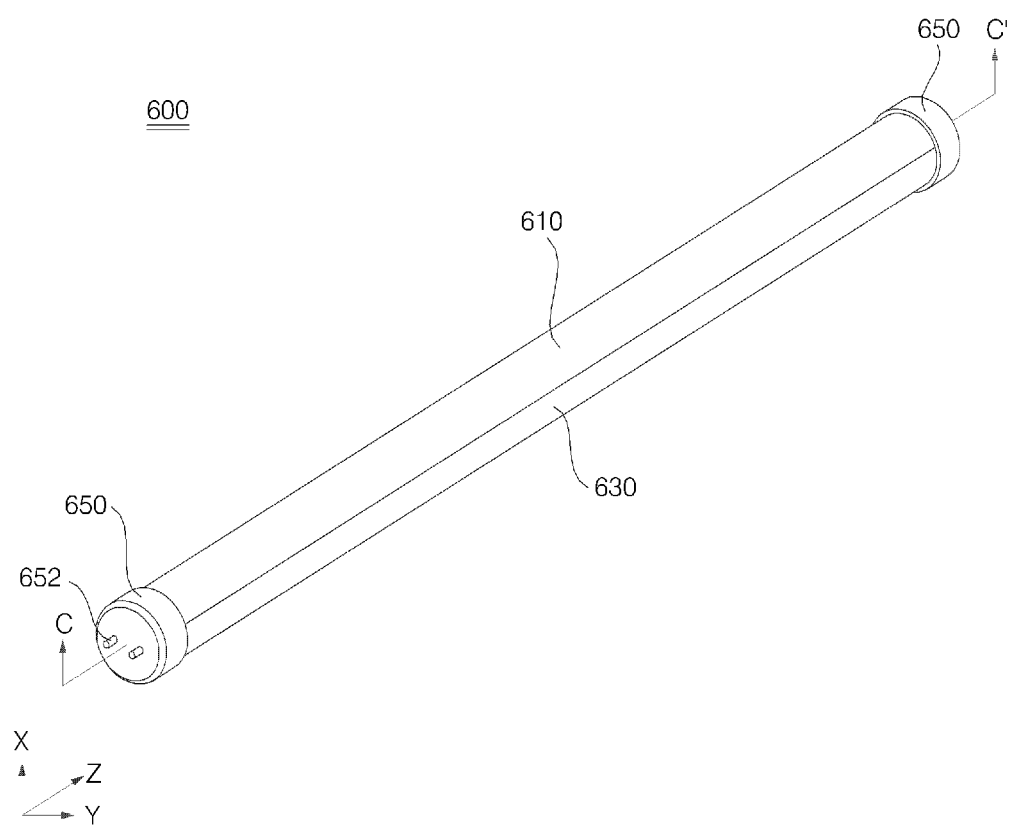
FIG. 9 is a perspective view illustrating a lighting apparatus including A light emitting diode according to an exemplary embodiment.
Figure 10:
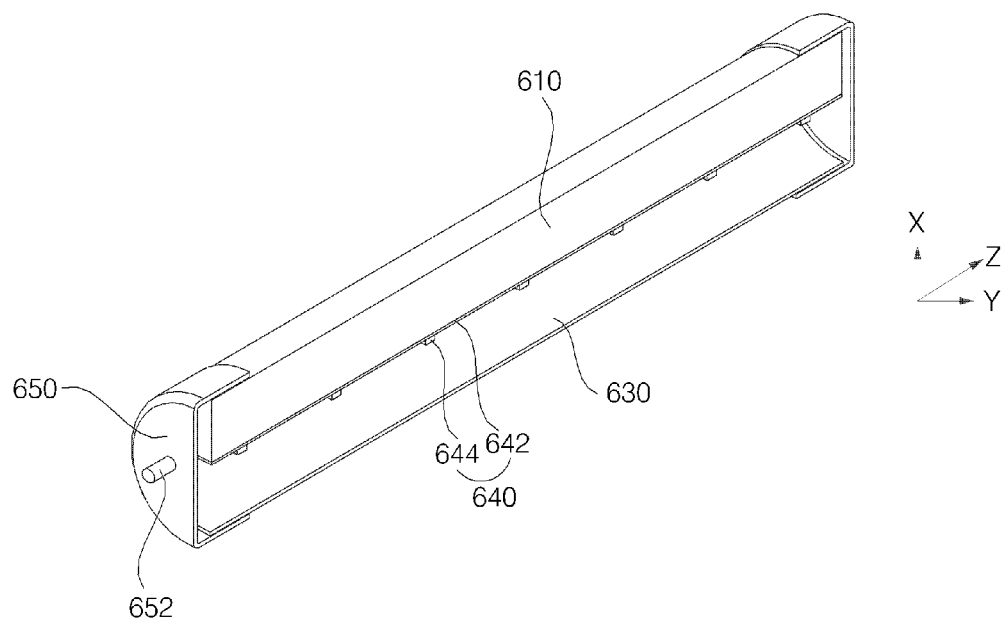
FIG. 10 is a cross-sectional view taken along a line C-C' in FIG. 9.

FIG. 9 is a perspective view illustrating a lighting apparatus including A light emitting diode according to an exemplary embodiment. FIG. 10 is a cross-sectional view taken along a line C-C' in FIG. 9.

Referring to FIGS. 9 and 10, the lighting apparatus, which is designated by reference numeral "600" may include a body 610, a cover 630 coupled to the body 610, and end caps 650 located at both ends of the body 610.

A light emitting diode module 640 is coupled to a lower surface of the body 610. The body 610 may be made of a metal material exhibiting excellent conductivity and excellent heat radiation effects to outwardly dissipate heat generated from light emitting device packages 644 through an upper surface of the body 610.

The light emitting device packages 644 may be mounted on a printed circuit board (PCB) 642 in multiple rows while having various colors, to form a multi-color array. The light emitting device packages 644 may be mounted at the same distance, or may be mounted at different distances to enable brightness adjustment, if necessary. The PCB 642 may be a metal core PCB (MCPCB) or a PCB made of a flame retardant-4 (FR4) material.

Each light emitting device package 644 may include an extended lead frame (not shown) so that it may have an enhanced heat dissipation function. Thus, it may be possible to enhance the reliability and efficiency of the light emitting device package 644. In addition, it may be possible to extend the life span of the lighting apparatus 600, which includes the light emitting device packages 644.

The cover 630 may have a circular shape to surround the lower surface of the body 610, although the present disclosure is not limited thereto.

The cover 630 protects the light emitting device module 640 from external foreign matter, etc. The cover 630 may contain light diffusion particles to achieve anti-glare effects and uniform emission of light generated from the light emitting device packages 644. At least one of the inner and outer surfaces of the cover 630 may be provided with a prism pattern. Also, a fluorescent substance layer may be coated over at least one of the inner and outer surfaces of the cover 630.

Since the light generated from the light emitting device packages 644 is outwardly emitted through the cover 630, the cover 630 should have high light transmittance and heat resistance sufficient to endure heat generated from the light emitting device packages 644. To this end, the cover 630 may be formed of polyethylene terephthalate (PET), polycarbonate (PC) or polymethylmethacrylate (PMMA).

The end caps 650 may be disposed at both ends of the body 610 and function to seal a power supply device (not shown). Each end cap 650 is provided with power pins 652, so that the lighting apparatus 600 in accordance with the illustrated embodiment may be directly connected to a terminal, which is provided for a conventional fluorescent lamp, without an additional connector.

Figure 11:
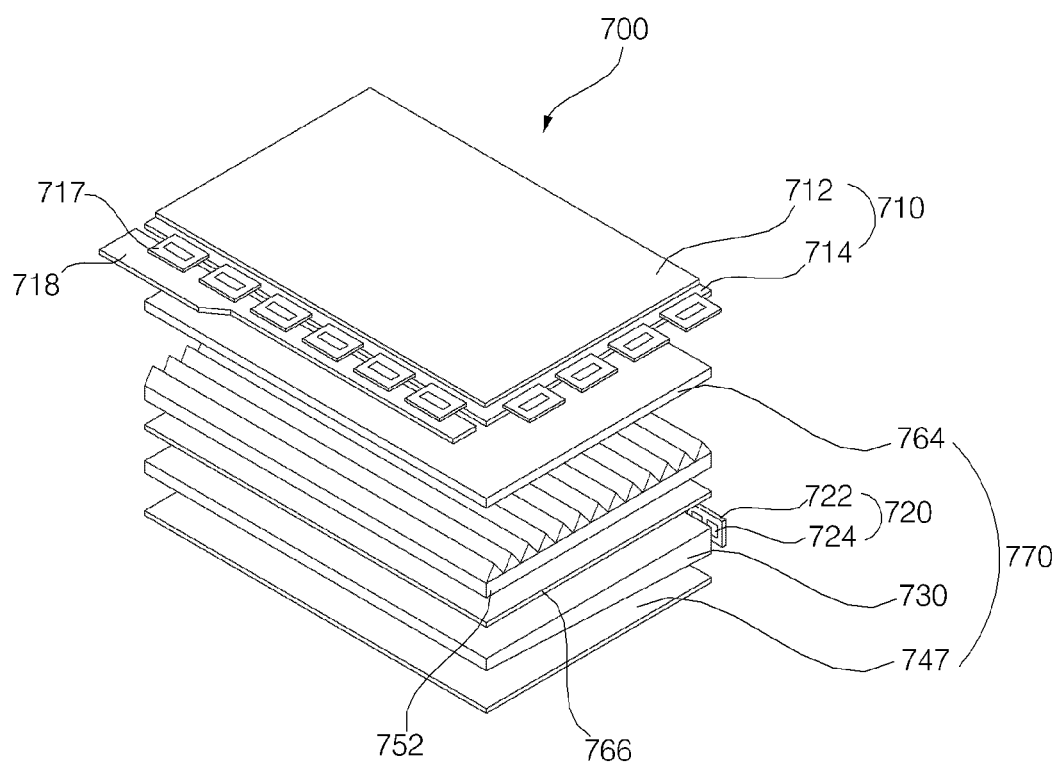
FIG. 11 is an exploded perspective view illustrating a liquid crystal display apparatus including A light emitting diode according to an exemplary embodiment.

FIG. 11 is an exploded perspective view illustrating a liquid crystal display apparatus including A light emitting diode according to an exemplary embodiment.

FIG. 11 illustrates an edge-light type liquid crystal display apparatus 700. The liquid crystal display apparatus 700 may include a liquid crystal display panel 710 and a backlight unit 770 to supply light to the liquid crystal display panel 710.

The liquid crystal display panel 710 may display an image using the light supplied from the backlight unit 770. The liquid crystal display panel 710 may include a color filter substrate 712 and a thin film transistor substrate 714, which are opposite each other with liquid crystals interposed therebetween.

The color filter substrate 712 may realize the color of an image displayed on the liquid crystal display panel 710.

The thin film transistor substrate 714 is electrically connected to a PCB 718, on which a plurality of circuit elements is mounted, by means of a drive film 717. The thin film transistor substrate 714 may apply drive voltage provided by the PCB 718 to liquid crystals in response to a drive signal transmitted from the PCB 718.

The thin film transistor substrate 714 may include thin film transistors and pixel electrodes in the form of thin films formed on another substrate made of a transparent material such as glass or plastic.

The backlight unit 770 includes A light emitting diode module 720 to emit light, a light guide plate 730 to change light emitted from the light emitting device module 720 into planar light and to transmit the planar light to the liquid crystal display panel 710, a plurality of films 750, 766 and 764 to achieve uniformity in brightness distribution and improved vertical incidence of light emerging from the light guide plate 730, and a reflection sheet 740 to reflect light emitted rearwards from the light guide plate 730 toward the light guide plate 730.

The light emitting device module 720 may include a plurality of light emitting device packages 724 and a PCB 722 on which the plurality of light emitting device packages 724 is mounted to form an array.

Meanwhile, the backlight unit 770 may include a diffusion film 766 to diffuse light incident thereupon from the light guide plate 730 toward the liquid crystal display panel 710, and a prism film 750 to condense the diffused light so as to enhance vertical light incidence. The backlight unit 770 may further include a protection film 764 to protect the prism film 750.

Figure 12:
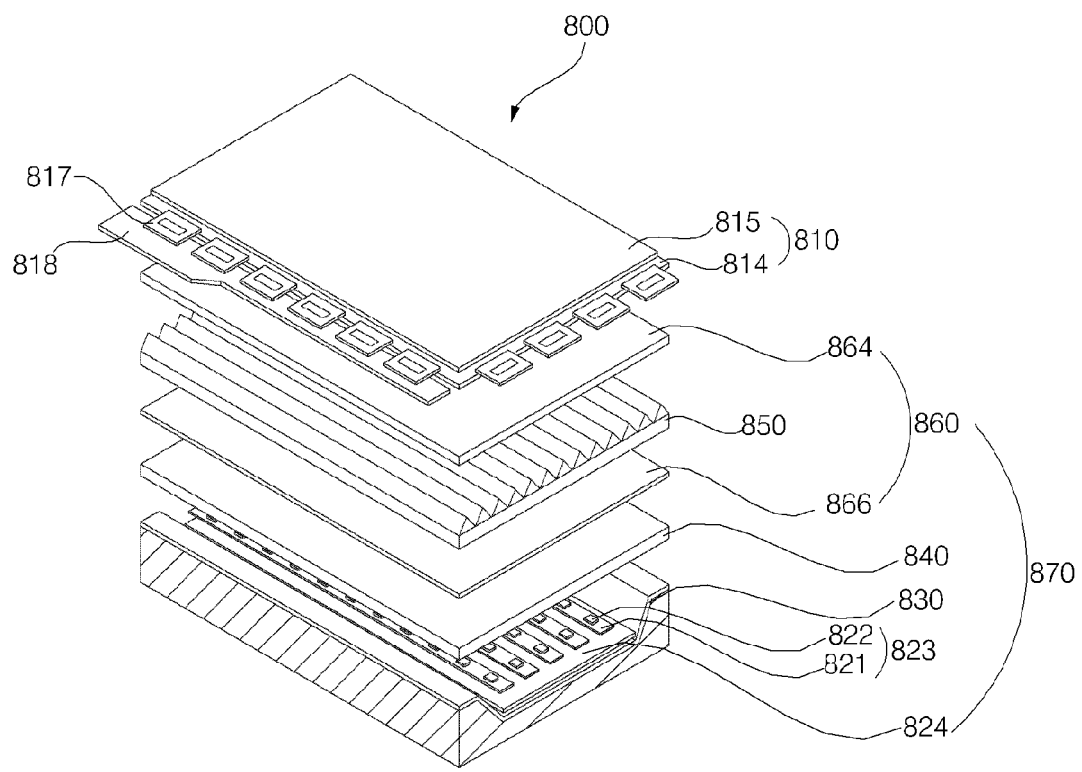
FIG. 12 is an exploded perspective view illustrating a liquid crystal display apparatus including A light emitting diode according to another embodiment.

FIG. 12 is an exploded perspective view illustrating a liquid crystal display apparatus including A light emitting diode according to another embodiment. The same configuration as that illustrated in FIG. 11 and described with reference to FIG. 11 will not be repeatedly described in detail.

FIG. 12 illustrates a direct type liquid crystal display apparatus 800 including a liquid crystal display panel 810 and a backlight unit 870 to supply light to the liquid crystal display panel 810.

The liquid crystal display panel 810 is identical to that of FIG. 11 and, as such, no detailed description thereof will be given.

The backlight unit 870 may include a plurality of light emitting device modules 823, a reflection sheet 824, a lower chassis 830 in which the light emitting device modules 823 and reflection sheet 824 are accommodated, and a diffusion sheet 840 and a plurality of optical films 860, which are disposed over the light emitting device modules 823.

Each light emitting device module 823 may include a plurality of light emitting device packages 822, and a PCB 821 on which the plurality of light emitting device packages 822 is mounted to form an array.

The reflection sheet 824 reflects light generated by the light emitting device packages 822 toward the liquid crystal display panel 810, to achieve an enhancement in light utilization efficiency.

Meanwhile, the light generated from the light emitting device modules 823 is incident upon the diffusion sheet 840. The optical films 860 are disposed over the diffusion sheet 840. The optical films 860 may include a diffusion film 866, a prism film 850 and a protection film 864.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

What is claimed is:

1. A light emitting diode, comprising:
   a light emitting structure comprising a first semiconductor layer, a second semiconductor layer, and an active layer interposed between the first and second semiconductor layers;
   a first electrode electrically connected to the first semiconductor layer;
   a second electrode electrically connected to the second semiconductor layer; and
   a reflection layer comprising a first reflection layer disposed on the light emitting structure and a second reflection layer disposed between the second electrode and the active layer,
   wherein the first reflection layer comprises at least a first layer having a first index of refraction and a second layer having a second index of refraction different from the first index,
   wherein the first reflection layer is disposed on a side surface of the second electrode and on a portion of an upper surface of the second electrode,
   wherein the second reflection layer comprises a third layer having a third index of refraction and a fourth layer having a fourth index of refraction different from the third index,
   wherein the first electrode comprises a first electrode pad,
   wherein the second electrode comprises a second electrode pad disposed on one side of the second semiconductor layer, and at least one second electrode wing connected to the second electrode pad and extending from the second electrode pad toward the first electrode pad,
   wherein a side surface of at least one of the first electrode pad and the second electrode pad comprises at least one of an inclined surface and a step, and
   wherein the first reflection layer is formed on the active layer, and at least a portion of the first reflection layer is vertically overlapped with at least one of the first electrode pad and the second electrode pad.

2. The light emitting diode according to claim 1, wherein the first layer and the second layer are alternately disposed parallel to the active layer.

3. The light emitting diode according to claim 2, wherein the third layer and the fourth layer are alternately disposed.

4. The light emitting diode according to claim 1, further comprising:
   a light-transmitting electrode layer formed between the first reflection layer and the light emitting structure.

5. The light emitting diode according to claim 4, further comprising:
   a substrate disposed under the light emitting structure; and
   a surface pattern formed on a lower surface of the substrate.

6. The light emitting diode according to claim 1,
   wherein a portion of an upper surface of the first semiconductor layer is exposed, wherein the first electrode is disposed on the exposed portion of the upper surface of the first semiconductor layer, and wherein the first electrode pad is arranged opposite the second electrode pad, and wherein the first electrode further comprises at least one first electrode wing connected to the first electrode pad and extending from the first electrode pad toward the second electrode pad.

7. The light emitting diode according to claim 6, wherein the first reflection layer is further disposed on an upper surface of the first semiconductor layer and extends from an upper surface of the second semiconductor layer to the upper surface of the first semiconductor layer along a side surface of the second semiconductor layer and a side surface of the active layer.

8. The light emitting diode according to claim 7, wherein the first reflection layer extends from the upper surface of the first semiconductor layer to a portion of an upper surface of the first electrode wing along a side surface of the first electrode wing.

9. The light emitting diode according to claim 7, wherein the first reflection layer extends from the upper surface of the first semiconductor layer to a portion of an upper surface of the first electrode pad along a side surface of the first electrode pad.

10. The light emitting diode according to claim 1, wherein the first layer or the second layer has a thickness of 0.0002 μm to 10 μm.

11. The light emitting diode according to claim 1, further comprising:

a current blocking layer disposed on the active layer, wherein at least a portion of the current blocking layer is vertically overlapped with the second electrode pad.

12. The light emitting diode according to claim 11, wherein the current blocking layer has a greater width than the second electrode pad.

13. The light emitting diode according to claim 3, wherein the first layer and the third layer have the same index of refraction.

14. The light emitting diode according to claim 3, wherein the second layer and the fourth layer have the same index of refraction.

15. A light emitting diode package, comprising:

a light emitting diode, wherein the light emitting diode comprises a light emitting structure comprising a first semiconductor layer, a second semiconductor layer, and an active layer interposed between the first and second semiconductor layers;

a body comprising a first lead frame, on which the light emitting diode is disposed, and a second lead frame spaced apart from the first lead frame;

a first electrode electrically connected to the first semiconductor layer;

a second electrode electrically connected to the second semiconductor layer; and a reflection layer comprising a first reflection layer disposed on the light emitting structure and a second reflection layer disposed between the second electrode and the active layer, wherein the first reflection layer comprising at least a first layer having a first index of refraction and a second layer having a second index of refraction different from the first index of refraction, wherein the first reflection layer is further disposed on a side surface of the second electrode and a portion of an upper surface of the second electrode, wherein the second reflection layer comprises a third layer having a third index of refraction and a fourth layer having a fourth index of refraction different from the third index, wherein the first electrode comprises a first electrode pad, wherein the second electrode comprises a second electrode pad disposed on one side of the second semiconductor layer, and at least one second electrode wing connected to the second electrode pad and extending from the second electrode pad toward the first electrode pad, wherein a side surface of at least one of the first electrode pad and the second electrode pad comprises at least one of an inclined surface and a step, and wherein the first reflection layer is formed on the active layer, and at least a portion of the first reflection layer is vertically overlapped with at least one of the first electrode pad and the second electrode pad.

16. The light emitting diode package according to claim 15, wherein the first layer and the third layer have the same index of refraction.

17. The light emitting diode package according to claim 15, wherein the second layer and the fourth layer have the same index of refraction.

* * * * *